United States Patent
Soane

[19]

[11] Patent Number: 5,945,203
[45] Date of Patent: Aug. 31, 1999

[54] STRATIFIED COMPOSITE DIELECTRIC AND METHOD OF FABRICATION

[75] Inventor: David S. Soane, Piedmont, Calif.

[73] Assignee: ZMS LLC, San Leandro, Calif.

[21] Appl. No.: 08/949,984

[22] Filed: Oct. 14, 1997

[51] Int. Cl.[6] .............................. B32B 9/00; B32B 15/06
[52] U.S. Cl. ...................... 428/209; 428/465; 257/642; 257/759; 257/643; 174/255; 174/258
[58] Field of Search ..................................... 428/428, 209, 428/465; 257/759, 760, 635, 639–644, 649–650; 439/66, 67; 174/255, 261, 258

[56] References Cited

U.S. PATENT DOCUMENTS

| | | | |
|---|---|---|---|
| 3,760,091 | 9/1973 | Cannizzaro et al. | 174/256 |
| 4,464,701 | 8/1984 | Roberts et al. | 257/640 |
| 4,859,189 | 8/1989 | Petersen et al. | 439/66 |
| 4,872,047 | 10/1989 | Fister et al. | 257/643 |
| 4,902,234 | 2/1990 | Brodsky et al. | 439/67 |
| 5,138,428 | 8/1992 | Hainz et al. | 257/780 |
| 5,157,589 | 10/1992 | Cole, Jr. et al. | 257/759 |
| 5,350,621 | 9/1994 | Yuhas et al. | 428/209 |
| 5,450,286 | 9/1995 | Jacques et al. | 439/67 |
| 5,500,280 | 3/1996 | Yamazaki et al. | 428/220 |
| 5,652,559 | 7/1997 | Saia et al. | 257/644 |

*Primary Examiner*—Deborah Jones
*Assistant Examiner*—Cathy F. Lam
*Attorney, Agent, or Firm*—Blakely, Sokoloff, Taylor & Zafman LLP

[57] ABSTRACT

An interconnect platform and its method of fabrication is presented. The interconnect platform of the present invention includes a metal conductor, a dielectric layer, and a buffer layer separating at least one interface between the conductor and the dielectric layer when the buffer has a lower modulus of elasticity than the dielectric layer.

26 Claims, 7 Drawing Sheets

FIG.3A
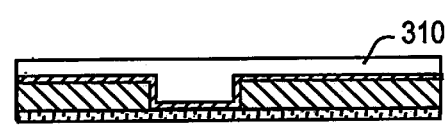
FIG.3B
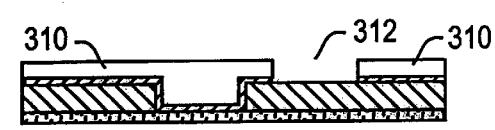
FIG.3C
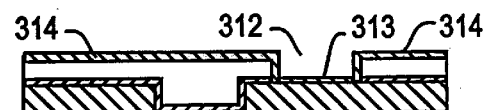
FIG.3D
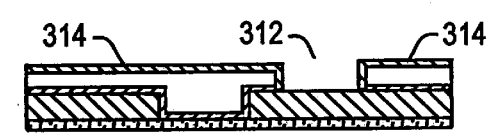
FIG.3E
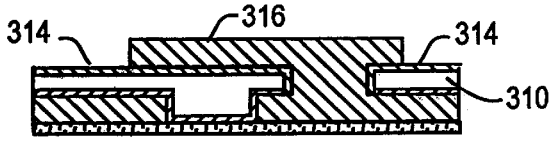
FIG.3F
FIG.3G
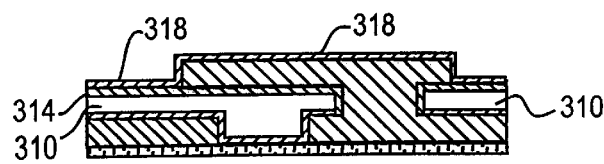
FIG.3H
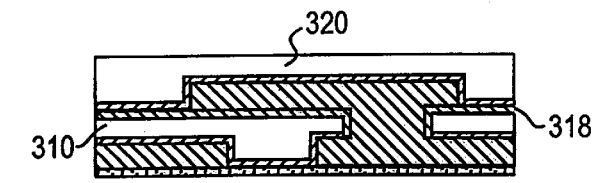
FIG.3I
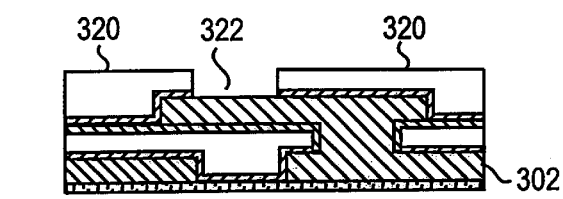
FIG.3J
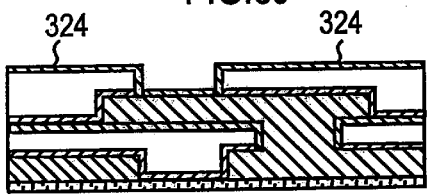
FIG.3K
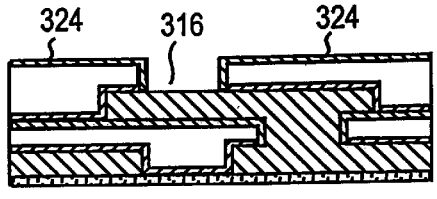
FIG.3L
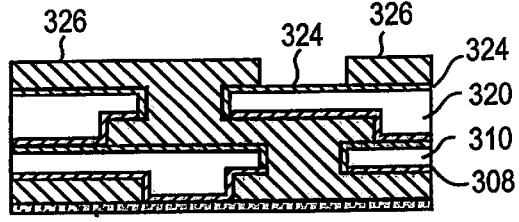
FIG.3M

ACID FUNCTIONAL EPOXYACRYLATE

RUBBERY-CHAIN DERIVATIZED EPOXY ACRYLATE

STRATIFIED COMPOSITE DIELECTRIC AND METHOD OF FABRICATION

BACKGROUND OF THE INVENTION

1. Field of the Invention

The present invention relates to the field of interconnect technology for electrically coupling integrated circuits, and more specifically to high density interconnect platforms.

2. Discussion of Related Art

As integrated circuit (ICs) transistor densities have continued to balloon, the need for input and output bandwidth has also increased. Thus there is now an ever increasing demand on chip interconnect technology to provide high density routing of conductors and to provide increased levels of interconnection in order to prevent the interconnection platform from becoming the bottleneck of systems which utilize modem high speed processors and associated chips.

An exploded view of one example high speed CPU packaging strategy is shown in FIG. 1. A high speed microprocessor 102 having a heat sink 101 attached thereto is connected to a multichip substrate 104 by flip chip solder bumps 106 which enable high density I/O connections between microprocessor 102 and substrate 104. Secondary integrated circuits such as SRAM cache chips, which have large signal interaction with the microprocessor, may also be connected to the multichip substrate 104. The multichip substrate 104 and its associated IC's are then electrically coupled by, for example, solder bumps 108 to a printed wiring board 110 on which the other IC's of the system are connected. The printed wiring board 110 is typically formed from an FR-4 epoxy board, with a single built-up layer 114 on each side connected by plated-through holes (not shown).

Multichip substrate 104 typically comprises an internal BT fiber base board 111 through which plated through holes 113 are fabricated. Formed on the outer surfaces of the BT fiber based board are built up layers 112 of metal and dielectrics for signal routing and bond pad formation.

With the need for increased signal propagation speeds and increased routing densities, material and process development trends have progressed towards achieving greater numbers of layers, thinner dielectrics, smaller via size and finer conductive lines for built up layers 112 and 114. As such, the current approach is to use photodefinable unreinforced polymer dielectrics to provide multi-layer stack-ups and to use microvias instead of plated through holes (PTH) to provide vertical interconnection. In such a process polymers are patterned to define microvias and then thin metal lines are formed directly on the polymers and in the microvias to provide electrical routing.

One problem with this approach is that metals such as copper have significantly lower coefficients of thermal expansion (CTE) than do organic dielectrics such as photo definable polymers. Between periods of microprocessor use and non-use, the CPU package may experience temperature shifts between room temperature (25° C.) and operating temperatures of 100–150° C. Such temperature cycling in the presence of a CTE mismatch creates a tremendous amount of stress within the interconnect platform, which often concentrates around sharp corners of the metal lines. When such stress exists on thin conductive lines or in microvias, adhesion problems often result between the conductive and dielectric layers which can lead to electrical performance degradation and interconnection failure. For example, as shown in FIG. 2a, stress can cause crack 202 propagation across the entire organic polymer dielectric layer 204 causing lift-off of the metal layer 206 above as well as electrical failure of dielectric 204. Additionally, as shown in FIG. 2b, stress caused by bonding and clamping-induced curvature flattening can lead to bond pad 210 lift-off. These and other stress-related problems create an inherent reliability problem in the current art of interconnect technologies.

Thus, what is desired is a method to remove or reduce the stress between rigid dielectrics and metal conductors in a single or multiple layer stack-up so that high density interconnection platforms can be reliably fabricated and operated.

SUMMARY OF THE INVENTION

An interconnection platform and its method of fabrication is described. The interconnection platform of the present invention includes one or more metal conductors, one or more dielectric layers, and a buffer dielectric layer separating at least one conductor/dielectric layer interface, wherein the buffer dielectric layer has a lower modulus of elasticity than the dielectric layer.

BRIEF DESCRIPTION OF THE DRAWINGS

FIG. 3a is a cross-sectional view illustrating the formation of a first conductive layer on a substrate.

FIG. 3b is a cross-sectional view illustrating the formation of a buffer dielectric layer on the substrate of FIG. 3a.

FIG. 3c is a cross-sectional view illustrating the formation of a hard dielectric layer.

FIG. 3d is a cross-sectional view illustrating the formation of a microvia on the substrate of FIG. 3c.

FIG. 3e is a cross-sectional view illustrating the formation of a second buffer dielectric layer on the substrate of FIG. 3d.

FIG. 3f is a cross-sectional view illustrating the removal of the second buffer dielectric layer from the microvia in the substrate of FIG. 3e.

FIG. 3g is a cross-sectional view illustrating the formation of a second conductive layer on the substrate of FIG. 3f.

FIG. 3h is a cross-sectional view illustrating the formation of a third buffer dielectric layer on the substrate of FIG. 3g.

FIG. 3i is a cross-sectional view illustrating the formation of a second hard dielectric layer on the substrate of FIG. 3h.

FIG. 3j is a cross-sectional view illustrating the formation of a microvia in the substrate of FIG. 3i.

FIG. 3k is a cross-sectional view illustrating the formation of a fourth buffer dielectric layer on the substrate of FIG. 3j.

FIG. 3l is a cross-sectional view illustrating the removal of the fourth buffer dielectric layer from a microvia on the substrate of FIG. 3k.

FIG. 3m is a cross-sectional view illustrating the formation of a third conductive layer on the substrate of FIG. 3l.

FIG. 4b is a cross-sectional view illustrating the formation of a hard dielectric layer over the substrate of FIG. 4a.

FIG. 5b is an overhead view illustrating the patterning of the first buffer dielectric layer on the substrate of FIG. 5a.

DETAILED DESCRIPTION OF THE PRESENT INVENTION

Figure 1:
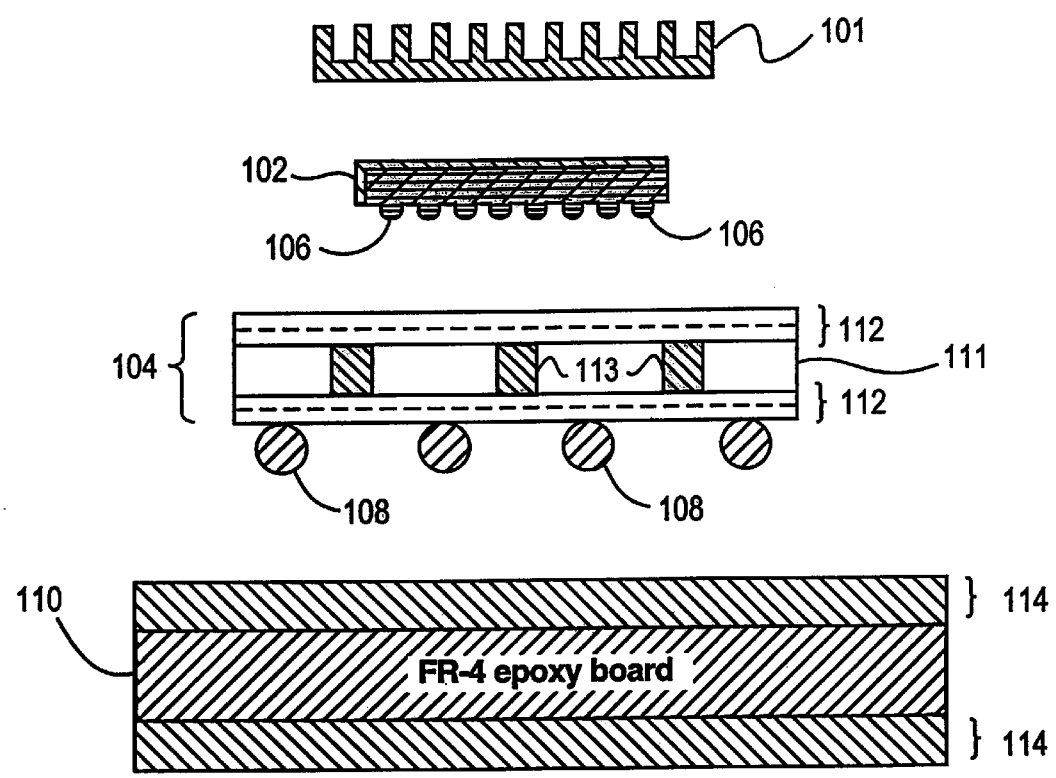
FIG. 1 is a cross-sectional view illustrating a current packaging strategy.
Figure 2A:
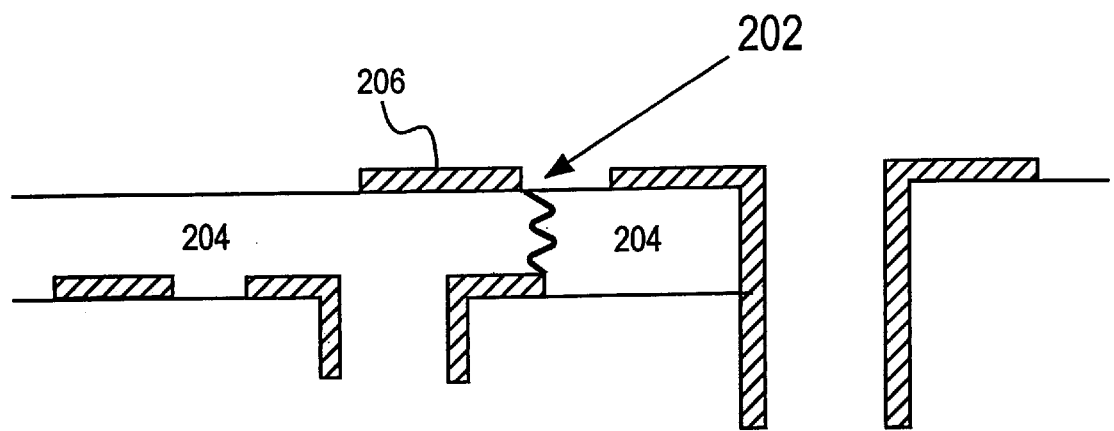
FIG. 2a is a cross-sectional view illustrating the formation of a crack through a polymer dielectric layer.
Figure 2B:
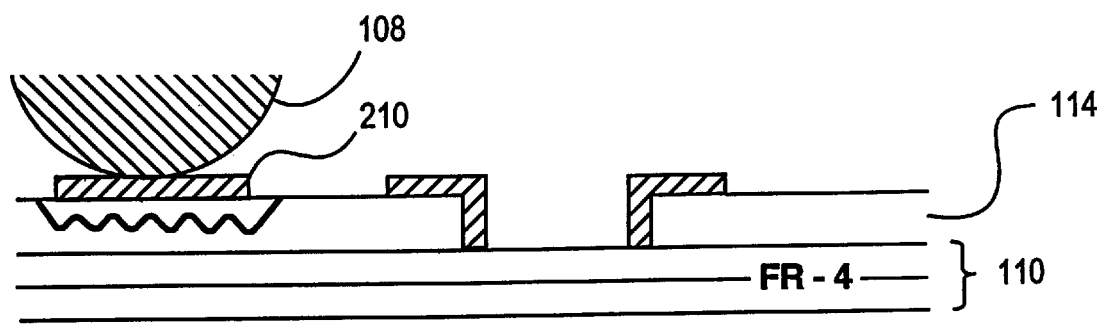
FIG. 2b is a cross-sectional view illustrating the lift-off of a bond pad from a multichip substrate.

The present invention is an interconnect platform having a stratified dielectric layer and its method of fabrication. In the following description numerous specific details are described, such as material types and deposition techniques, in order to provide a thorough understanding of the present invention. One skilled in the art, however, will appreciate that the present invention can be practiced without these specific details. In other instances, detailed descriptions of well-known fabrication techniques and equipment have been omitted in order to not unnecessarily complicate the present invention.

The present invention is a novel interconnect platform that can be used for interconnecting integrated circuits (IC's) together at any level of packaging including single chip packages, multi-chip packages, and printed wiring boards (motherboards) for systems. The interconnect platform of the present invention utilizes a novel stratified or segmented composite dielectric layer which includes a hard rigid dielectric layer such as an epoxy resin (or a polyimide resin), and a soft rubbery dielectric layer, such as an epoxy resin with a large concentration of rubber modifiers. The hard rigid dielectric provides mechanical support or framework for the interconnect platform. The rubbery buffer dielectric, which is formed in direct contact with the metal conductors, provides stress relief between the conducting film and the rigid dielectric layer.

Providing a soft dielectric material between adjacent conductor/dielectric levels greatly reduces the shear stress generated from temperature cycling and shocks, resulting in improved reliability of the interconnect platform. Additionally, decoupling the stress between the hard rigid dielectric and the conductors enables an increase in the number of layers that can be incorporated into the multilayer stack. Furthermore, the dimensions (line width and spacing) can be decreased without sacrificing reliability, thus enabling higher densities of interconnection.

The soft rubbery dielectric layer can be formed by a "surface modification" technique where the rigid dielectric layer is first deposited and then its outer surface transformed or modified into a soft rubbery dielectric. Alternatively, the soft rubbery dielectric and the rigid dielectric can be independently deposited in a "stack-up" technique. The interconnect platform of the present invention can be fabricated in such a manner that the conductive lines are completely encapsulated or surrounded on all sides by the buffer dielectric. Alternatively, the interconnect platform of the present invention can be fabricated in such a manner that the buffer dielectric layer is formed only on a single side of the conductive line or fabricated only at specific high stress locations of the platform such as corners and vias. Finally, the buffer layer may only be incorporated on one or a few of the several layers constituting the multilevel scheme; this critical layer may be directly under the bonding layer of the substrate and/or directly above the base substrate.

Various embodiments of the present invention will now be described. It is to be appreciated that the different embodiments of the present invention can be used independently or in combination with one another in order to fabricate a variety of different high-performance, high-reliability interconnect platforms or substrates.

FIGS. 3a–3m illustrate a simple "stack-up" method of fabricating a multilayer interconnect platform with a stratified composite dielectric layer. In its simplest form the "stack-up" process uses repeated deposition, imaging, and development cycles to form a composite stratified dielectric layer. The "stack-up" fabrication process begins with the formation of a first conductor layer 302 on a base substrate 300 such as but not limited to an FR-4 or BT plate. The conductive layer is generally a low resistance metal such as but not limited to copper (Cu), gold (Au), silver (Ag), and aluminum (Al). The metal conductive layer may or may not include adhesion and/or diffusion barrier layers such as but not limited to titanium, nickel, palladium, and chromium. A metal conductive layer 302 can be formed by any well-known technique such as but not limited to electroplating, electrolessplating, and/or sputtering. Metal layer 302 can be formed into individual metal conductors during electroplating or can be patterned into individual metal conductors by well-known photolithography and etching techniques. Metalization layer 302 can have a thickness in the range of 1–100 μm (microns) with metal spacings of 1–100 μm, depending on the application and interconnect density desired.

Next, as shown in FIG. 3b, a soft rubbery dielectric layer 308 is deposited over metal conductors 304 and 306 and over substrate 300. Buffer dielectric layer 308 is formed of materials and by processes which produce a compliant film with a modulus of elasticity of between 1 MPa to–1 GPa, and preferably with a dielectric constant less than 4. Additionally, buffer dielectric layer 308 is preferably a photodefinable dielectric layer.

In one embodiment of the present invention, buffer dielectric layer 308 comprises: i) a resin, such as but not limited to an epoxy, urethane, epoxy-acrylate, epoxy-cinnamate, and/or cyanate ester resin and ii) a resin modifier or a combination of modifiers which make the resin more rubbery such as but not limited to carboxy-terminated butadiene-acrylonitrile rubber (CTBN), vinyl-terminated acrylonitrile-modified butadiene (VTBN), and/or glycidyl acrylate-derivatized CTBN. Buffer dielectric layer 308 will include a sufficient amount of rubber modifiers in order to produce a buffer dielectric layer 308 with an elastic modulus between 1 MPa to 1 GPa.

Additionally, the rubber modifiers are preferably provided in a concentration sufficient to lower the glass transition temperature of the dielectric film 308 to below the lowest temperature experienced by the interconnect platform which is typically room temperature, 25° C. Alternatively, some benefit can be realized by providing a buffer dielectric having a glass transition temperature between room temperature and the service temperature (operating temperature) of the platform which is typically between 100–150° C.

Buffer dielectric layer 308 can also include photoinitiators such as but not limited to 2,2,dimethoxy-2-phenylacetophenone (DMPA), isopropyl thioxathane, or ethyl-4-(dimethylamino) benzoate. Additionally buffer dielectric layer 308 can include reactive monomer diluents such as but not limited to isobornyl acrylate (IBOA), N-vinyl pyrrolidone (NVP), tripropylene glycol diacrylate (TRPGDA), or trimethylolpropane triacrylate (TMPTA) which can be either thermally or photo-initiated in order to increase the crosslinking density of the buffer layer. Such reactive diluents can include compounds that upon curing form soft, rubbery polymer networks. Candidates are exemplified by long chain alkyl acrylates or methacrylates. Other additives such as fire retardants, pigments or dyes, antioxidants, wetting agents and fillers can also be included. All above referenced components are commercially available from chemical manufacturers such as Sartomer, Radcure, Henkel, Ciba Geigy or DuPont.

In a second embodiment of the present invention buffer dielectric layer 308 can be fabricated from a photo-imageable rubbery compound such as polyisobutylene diacrylate, polybutylene diacrylate, and alkyl acrylates with a $C_3$–$C_{18}$ alkane side group, linear or branched. In another embodiment of the present invention buffer dielectric layer 308 can be a negative photoresist such as bisarylazide-rubber resists, whose matrix resin is cyclized polyisoprene, a synthetic rubber. And in yet another embodiment of the present invention buffer dielectric layer 308 can be formulated by using combinations of ingredients used in "dry film resists" which contain a binder, monomer mixture, and photoinitiator. The monomer mixture can be developed from compounds such as an acrylated oligomer (methacrylated oligomer), or acrylated polymer (methacrylated polymer), as long as upon curing and crosslinking the resulting films have elastic moduli sufficiently low to act as stress buffers.

Buffer dielectric layer 308 can be deposited by any well-known technique such as by spin, spray, roller, or curtain coating which provides a suitable thickness and conformality. Buffer dielectric layer 308 can be formed to a thickness of conductor layer 302 or less.

Next, a hard dielectric layer 310 is formed over buffer dielectric layer 308 as shown in FIG. 3c. Hard dielectric layer 310 is formed of a material and to a thickness sufficient to provide a rigid framework to support the interconnect platform after complete curing. Hard dielectric layer 310 is typically formed of a material and by a method which produces a film with a modulus of elasticity of between 1–30 GPa. As such, the modulus of elasticity of buffer dielectric layer 308 is between 2–2,000 times lower than hard dielectric layer 310 and preferably between 10–1,000 times lower and more preferably between 100–1,000 times lower. Hard dielectric layer 310 will generally have a dielectric constant between 3.0–5.0

Hard dielectric layer 310 is preferably a self-planarizing photodefinable polymer which includes a resin or resin blend, such as but not limited to acrylated or methacrylated epoxy based resins which may or may not be blended with other urethane or triazine components; a resin modifier, such as but not limited to carboxy-terminated butadiene/acrylonitrile rubber (CTBN), epoxy-terminated butadiene/acrylonitrile rubber (ETBN), or vinyl-terminated acrylonitrile-modified butadiene (VTBN): a photoinitiator component, such as but not limited to 2,2,dimethoxy-2-phenylacetophenone (DMPA), isopropyl thioxathane, or ethyl-4-(dimethylamino) benzoate; and reactive monomer diluents such as but not limited to N-vinyl pyrolidone (NVP), isobornyl acrylate (IBOA), lauryl acrylate (LA), isodecyl acrylate (IDA), tripropylene glycol diacrylate (TRPGDA), or trimethylolpropane tricrylate (TMPTA). Although hard dielectric layer 310 can contain rubber additives in order to make the film less brittle, the concentration of the additives is low enough that it does not significantly change the modulus of elasticity of the dielectric which is kept in the range of 1–30 GPa. Additionally, the concentration of the rubber additives is kept low enough so that the glass transition temperature of the hard dielectric layer is above the highest service temperature (operating temperature) of the platform (100–150° C.). Hard dielectric layer 308 is typically formed to a thickness in the range of 1–200 μm and can be formed by any well-known and suitable technique such as spin, spray, roller, or curtain coating. Finally, hard rigid dielectrics may be inorganic in nature, such as silicon dioxide or silicon nitride. For the purpose of the ensuing process discussion, we will concentrate on organic polymer dielectrics only.

Next, as shown in FIG. 3d, microvias 312 are formed through hard dielectric layer 310 and buffer dielectric layer 308. Microvias are formed at those locations where electrical connection between metal layer 302 and a subsequently formed metal layer are desired. Microvias can be formed by contactless masking and light exposure to initiate polymerization in those areas irradiated by light. Microvias can be formed by removing the unpolymerized resin with a developer such as but not limited to organic or aqueous solvents to solvate the unpolymerized resin. After microvia hole formation, a final UV or thermal cure can be used to crosslink the resin.

Next, as shown in FIG. 3e, a second buffer dielectric layer 314 is formed on hard dielectric layer 310, on the sidewalls of hard dielectric layer 310, in microvia 312, and over metal layer 302 in microvia 312. Second buffer dielectric layer 314 can be formed of the same material and by the same techniques as described with respect to buffer dielectric layer 308.

Next, as shown in FIG. 3f, the portion 313 of second buffer dielectric layer 314 which is formed on conductive layer 302 in via 312 is removed in order to reopen via 312. Portion 313 of second buffer dielectric layer 312 can be removed by contactless masking and light exposure to initiate polymerization in those areas irradiated by light. Microvias can then be reopened by removing the unpolymerized resin with a developer such as but not limited to an organic or aqueous solvent to solvate the unpolymerized resin. After microvia 312 has been reopened, a final UV cure can be used to crosslink the resin in second buffer dielectric layer 314.

Next, as shown in FIG. 3g, a second conductive layer 316 is formed over second buffer dielectric layer 314 and onto metal conductor 302 and microvia 312. Second conductive layer 316 can be formed from materials and by methods such as those described with respect to metal conductor 302.

The above referenced process steps can now be repeated any number of times to build an interconnect platform with as many stacked insulator/metal layers as desired. For example, as shown in FIG. 3h, a third buffer dielectric layer can be deposited onto second conductive layer 316 and onto second buffer dielectric layer 314. Third buffer dielectric layer 318 can be formed with materials and by methods which were described with respect to first buffer layer 308.

Next, as shown in FIG. 3i, a second hard dielectric layer 320 is deposited over soft dielectric layer 318. Next, microvias 322 are formed through second hard dielectric layer 320 and third soft dielectric layer 318 as shown in FIG. 3j. Microvia 322 can be formed with techniques similar to those used to form microvia 312.

Next, as shown in FIG. 3k, a fourth buffer dielectric layer 324 is formed over second hard dielectric layer 320, along the sidewalls of hard dielectric layer 320 in microvia 322 and on second conductive layer 316 in microvia 322. Next, as shown in FIG. 3l, the fourth buffer dielectric layer 324 within microvia 322 is removed by previously described patterning steps to expose metal 316 in via 322. Next, as shown in FIG. 3m, a third level of metalization 326 is formed onto fourth soft dielectric layer 324 and onto second conductive layer 316 in microvia 322 to enable electrical coupling between the third metal conductive layer 326, the second conductive layer 316, and first conductive layer 306. Conductive layer 326 can be formed from materials and by methods as described with respect to first conductive layer 302.

As is readily apparent from FIG. 3m, the "stack-up" fabrication technique of the present invention produces an interconnect platform wherein all of the conductive layers and hard dielectric layers are separated or isolated from one another by a buffer dielectric layer. By buffering each of the hard dielectric/conductor interfaces with a buffer dielectric layer reliability of the interconnect platform is greatly improved.

FIGS. 4a–4i illustrate a "surface modification" method of fabricating a multi-layer interconnect platform having a stratified insulating dielectric layer. The fabrication process begins with the formation of a first conductor layer 402 on a substrate 400 such as but not limited to an FR-4 or BT plate. The conductive layer is formed from a low resistance metal such as but not limited to copper (Cu), gold (Au), silver (Ag), or aluminum (Al). The metal conductive layer may or may not include adhesion layers and/or diffusion layers, such as but not limited to titanium (Ti), nickel (Ni), palladium (Pd), and chromium (Cr). A metal conductor layer 402 can be formed by any well-known technique such as but not limited to electroplating, electrolessplating, and/or sputtering. Metal layer 402 can be formed into individual metal conductors 404 and 406 during electroplating or can be patterned into individual metal conductors 404 and 406 by well-known photolithography and etching techniques. Metalization layer 402 can have a thickness in the range of 1–100 $\mu$m with minimum metal spacings of 1–100 $\mu$m.

Figure 4A:
FIG. 4a is a cross sectional view illustrating the formation of a first metal layer on a substrate.
Figure 4F:
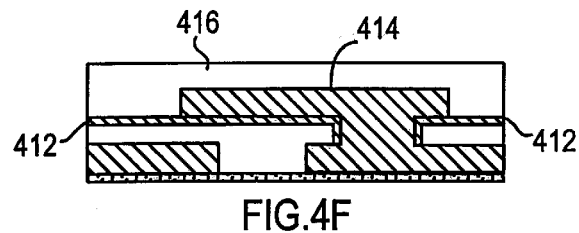
FIG. 4f is a cross-sectional view illustrating the formation of a second hard dielectric layer on the substrate of FIG. 4e.
Figure 4B:
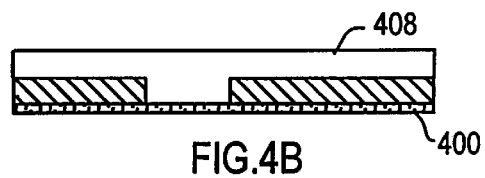

Next, as shown in FIG. 4b, a first hard dielectric layer 408 is formed over conductive lines 404 and 406 and substrate 400. Hard dielectric layer 408 is formed of materials and by processes which produce a film typically having an elastic modulus between 1–30 GPa with a thickness of between 1–200 $\mu$m. Additionally hard dielectric layer 408 preferably has a glass transition temperature above the highest service temperature of the interconnect platform which is typically between 100–150° C. Hard dielectric layer 408 is preferably a photo-definable, self-planarizing polymer such as but not limited to acrylated or methacrylated epoxy based resins having pendant hydroxyl groups which may or may not be blended with other urethane or triazine components.

Additives that may be included into hard dielectric layer 408 to impact performance-enhancing qualities include resin modifiers, such as but not limited to carboxy-terminated butadiene/acrylonitrile rubber (CTBN), epoxy-terminated butadiene/acrylonitrile rubber (ETBN), or vinyl-terminated acrylonitrile-modified butadiene (VTBN); photo initiator components, such as but not limited to 2,2,dimethoxy-2-phenylacetophenone (DMPA), isopropyl thioxathane, or ethyl-4-(dimethylamino) benzoate; reactive monomer diluents, such as but not limited to N-vinyl pyrolidone (NVP), isobornyl acrylate (IBOA), lauryl acrylate (LA), isodecyl acrylate (IDA), tripropylene glycol diacrylate (TRPGDA), or trimethylolpropane triacrylate (TMPTA); and flame retardants such as but not limited to brominated organic derivatives such as brominated bisphenol A epoxies, brominated VTBN, or inorganic fillers such as $Al_2O_3$ or $SbO_2$. Hard dielectric layer 408 can be deposited by any well-known technique including but not limited to roller, curtain, spin, or spray coating which is suitable to meet conformity and thickness requirements. After coating, hard dielectric layer 408 can be partially cured by exposing to an infrared heat source to ensure a void and bubble free film 408.

Figure 4G:
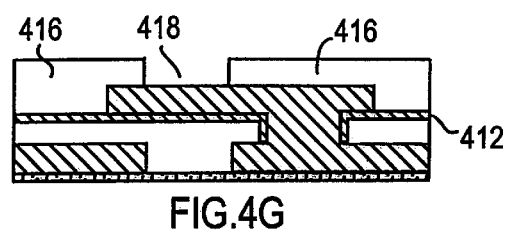
FIG. 4g is a cross-sectional view illustrating the formation of a microvia in the substrate of FIG. 4f.
Figure 4C:
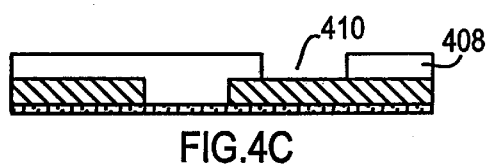
FIG. 4c is a cross-sectional view illustrating the formation of a microvia in the substrate of FIG. 4b.

Next, as shown in FIG. 4c, microvia holes 410 are formed in hard dielectric layer 408. Microvias are formed at locations where electrical contacts to underlying conductive layer 402 are desired. Microvias can be formed by contactless masking and light exposure to initiate polymerization in those areas irradiated by light. Microvias can then be formed by removing the unpolymerized resin with a developer such as but not limited to organic or aqueous solvents to solvate the unpolymerized resin. Microvias will usually have a width between 1–200 $\mu$m. After microvia hole 410 formation a final UV or thermal cure can be used to further crosslink the resin. Once hard dielectric layer 408 has been completely cured it should have a dielectric constant below 5.0, and typically between 3.0–5.0.

Figure 4H:
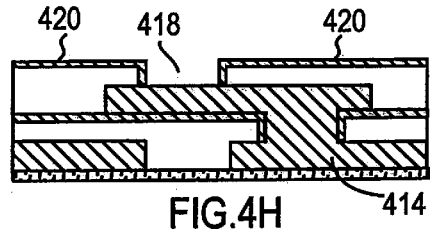
FIG. 4h is a cross-sectional view illustrating the surface modification of the hard dielectric of FIG. 4g.
Figure 4D:
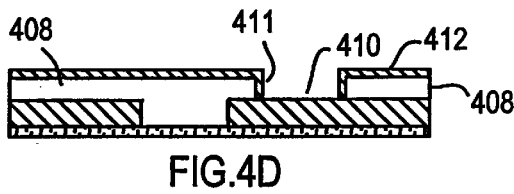
FIG. 4d is a cross-sectional view illustrating the surface modification of the hard dielectric of FIG. 4c.

Next, as shown in FIG. 4d, the exposed surfaces, including sidewalls 411, of hard dielectric layer 408 are modified to produce a soft rubbery buffer dielectric layer 412. The outer surfaces of hard dielectric layer 408 can be modified by exposing the surfaces of hard dielectric layer 408 to a surface-altering solution which softens the exposed surfaces of hard dielectric layer 408 to form a compliant buffer dielectric layer 412 on the top surface of hard dielectric layer 408 as well as on the sidewalls 411 of hard dielectric layer 408 which define microvias 410. The surface modification of the present invention produces a buffer dielectric layer which has an elastic modulus of between 1 MPa–1 GPa. The buffer dielectric layer has an elastic modulus which is between 2–2,000 times lower than the elastic modulus of hard dielectric layer 408 and which is preferably between 10–1,000 times lower and more preferably 100–1,000 times lower.

Figure 6A:
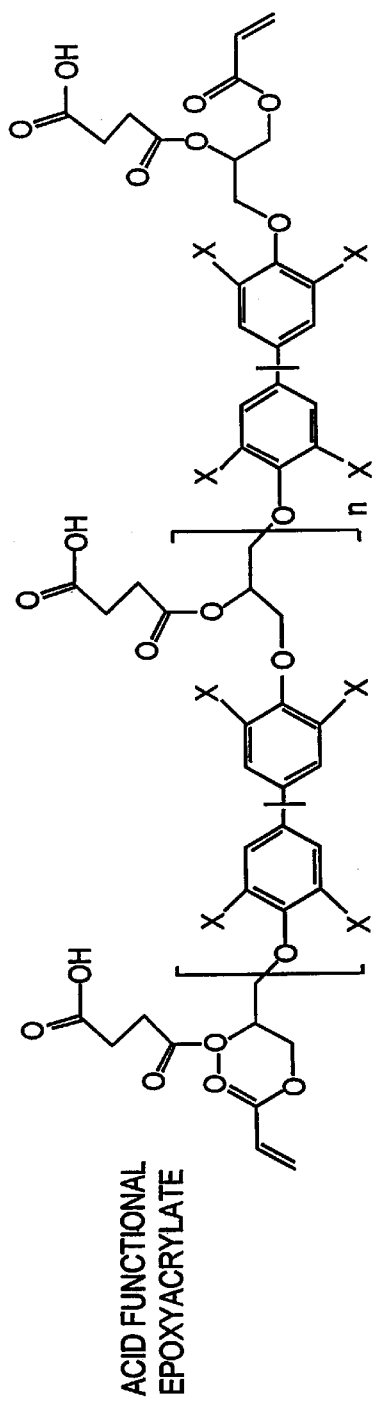
FIG. 6a is an illustration of an acid functional epoxy acrylate.

In one embodiment of the present invention hard dielectric layer 408 is modified into a soft rubbery dielectric layer 412 by the esterfication of pendant carboxyl groups provided in hard dielectric layer 408. Carboxyl groups are typically formulated into photo-definable epoxy based resins to allow for aqueous development of such films, as opposed to a less desirable organic solvent-based development. Carboxyl groups can be formed on the epoxy backbone by derivatization of pendant hydroxyls with cyclic anhydrides such as maleic, succinic and phthalic. A typical carboxy-derivatized epoxy resin is shown in FIG. 6a where n=0–3. Upon exposing the carboxyl groups to an acidic or alkaline alcohol solution, alcohol chains are grafted into the epoxy resin. Alternatively, the carboxyl groups may be first activated by exposure to thionyl chloride ($SOCl_2$), followed by exposure to an alcohol ($C_3$–$C_{18}$) solution. Such chemical treatments convert exposed surfaces of the hard epoxy resin into a flexible rubbery composition. The esterfication should graft alcohol chains on at least 30–50% of the available carboxyl/hydroxyl groups of the epoxy backbone.

Figure 6B:
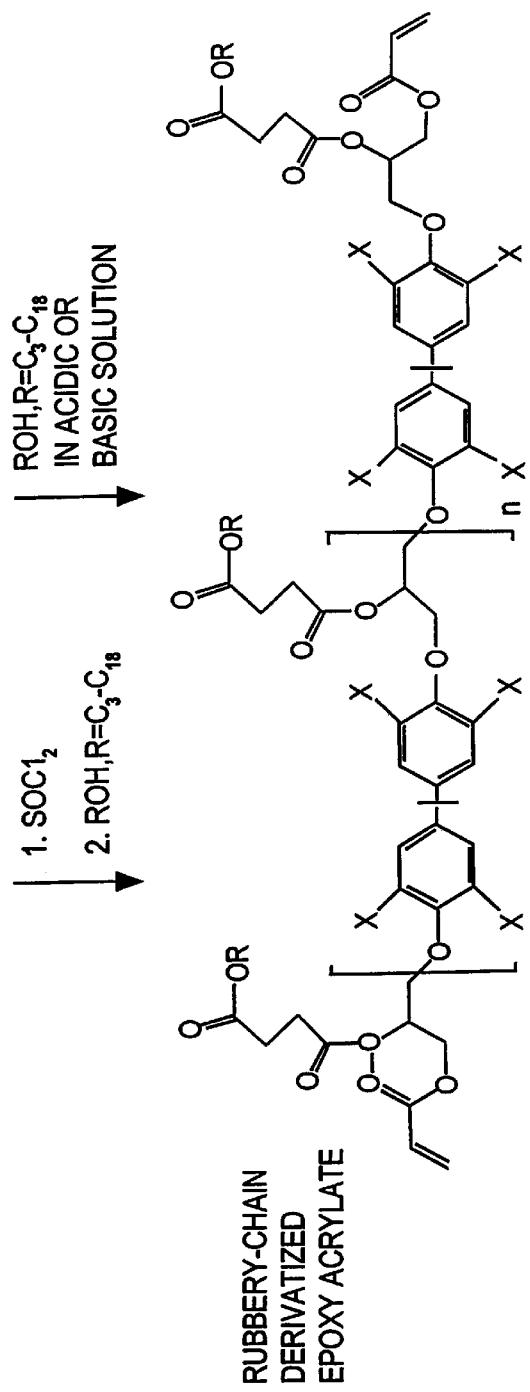
FIG. 6b is an illustration of a rubbery chain derivatized epoxy acrylate.

The esterfication alcohol may be a propyl, butyl, pentyl or higher alcohol. The alcohols used may contain primary, secondary or tertiary hydroxyl groups. The alcohols may range in size from $C_3$ to $C_{18}$. A single alcohol or mixture of alcohols may also be used. A wide range of temperatures are suitable for carrying out the dielectric modification treatment by esterfication. A satisfactory modification can be obtained by dipping in a suitable alcohol solution at a temperature in the range of 50° C.–300° C., followed by water rinsing. The time required for partial conversion of hard dielectric layer 408 is determined by the temperature, esterfication agent, and the degree of esterfication desired. The esterfication should produce a modified rubbery dielectric surface 412 having a thickness on the order of the thickness of the conductive lines or less. Upon treating the epoxy-based dielectric with the alcohol solution, the alcohol groups are grafted into the epoxy framework as shown in FIG. 6b. Such an esterfication reaction alters the polymer properties by decreasing the hardness (i.e., elastic modulus) of the material, thus resulting in a soft layer to provide mechanical buffering in the presence of shear stress.

Additionally, the surface modification of hard dielectric layer 408 preferably forms a buffer dielectric layer 412 with a glass transition temperature below the lowest temperature experienced by the interconnect platform which is typically room temperature, 25° C. Alternatively, some benefit can be realized by forming a buffer dielectric 408 having a glass transition temperature between room temperature and the service temperature (operation temperature) of the platform which is typically between 100–150° C.

It is to be appreciated that other well-known techniques in the art of polymer modification, such as trans-esterfication, etherification, or interpenetrating network formation can also be used to modify the surface of the rigid dielectric material to form a composite stack.

Figure 4I:
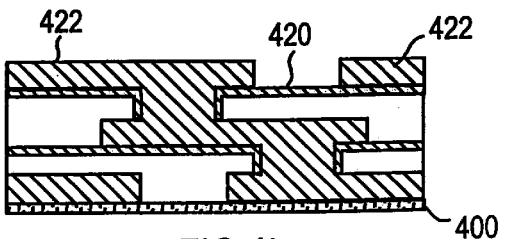
FIG. 4i is a cross-sectional view illustrating the formation of a third conductive layer on the substrate of FIG. 4h.
Figure 4E:
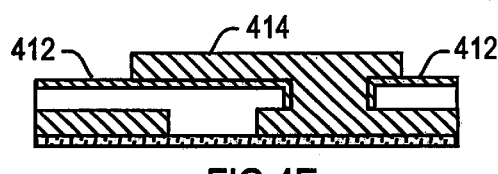
FIG. 4e is a cross-sectional view illustrating the formation of a second conductive layer on the substrate of FIG. 4d.

Next, as shown in FIG. 4e, a second conductive layer 414 is formed. Second conductive layer 414 is formed directly onto soft dielectric layer 412 and onto metal layer 402 in microvia 410 to enable electrical coupling between metal layer 402 and metal layer 414. Conductive layer 414 can be formed of metals and by methods described with respect to metal layer 402.

The above referenced steps can be repeated any number of times to produce a multilayer stack having any number of desired metal and insulating layers. For example, as shown in FIG. 4f, a second hard dielectric layer 416 can be formed on a second metal layer 414 and buffer dielectric layer 412. Second hard dielectric layer 416 can be formed of materials and by processes as those described with first hard dielectric layer 408. The second hard dielectric layer 416 can then be patterned to form microvia 418 as shown in FIG. 4g. Next, as shown in FIG. 4h, the surface of the second hard dielectric layer can be modified by the previously described surface modification technique to form a second buffer dielectric layer 420 on the outer surfaces of hard dielectric layer 416 and on the sidewalls of hard dielectric layer 416 and microvia 418. Next, as shown in FIG. 4i, another level of metalization 422 is deposited onto buffer dielectric layer 420 as well as on metal 414 and via 418 to enable electrical connections between metal layer 422, 414 and 402. Processing can be continued in the above referenced manner to produce a multilevel interconnect platform with many layers as desired.

As is readily apparent from FIG. 4i, the "surface modification" technique of the present invention forms a buffer dielectric layer which separates metal layers from the hard dielectric layer on one side of the metal layer (i.e., on the bottom of the metal layer). Although the surface modification technique of the present invention does not provide a buffer layer at all interfaces between the conductive layer and the hard dielectric layer, providing buffering on one side and along microvia sidewalls provides a dramatic improvement in reliability and performance. Additionally although the surface modification technique provides buffering on only one side of the metal lines, the simplicity of the surface modification technique reduces process steps and thereby reduces the manufacturing cost of the platform.

FIGS. 5a–5f illustrate a method of forming a stratified composite dielectric layer wherein buffer dielectric layers are formed only at high stress concentration points of the interconnect platform such as corners of metal lines and at microvias.

Figure 5A:
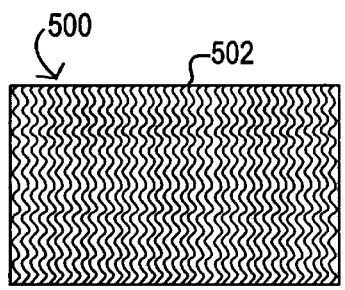
FIG. 5a is an overhead view illustrating the formation of a first buffer dielectric layer on a substrate.

According to the stress point concentration method of the present invention, a buffer dielectric layer 502 is formed over a substrate 500 as shown in FIG. 5a. Buffer dielectric layer 502 can be formed of materials and by methods as described with respect to buffer dielectric layer 308 to produce a buffer dielectric layer with similar mechanical and electrical properties as those described with buffer dielectric layer 308.

Figure 5B:
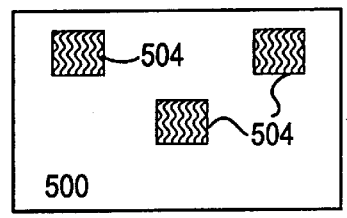
Figure 5C:
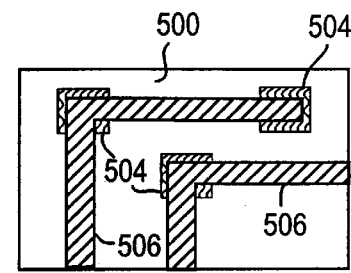
FIG. 5c is an overhead view illustrating the formation of a metal conductive pattern on the substrate of FIG. 5b.

Next, as shown in FIG. 5b, buffer dielectric layer 502 is patterned so that buffer dielectric layer 502 remains at only high stress locations 504. Next, as shown in FIG. 5c, a metal conductive layer 506 having a plurality of metal lines is formed over substrate 500 and over patterned buffer dielectric layer 504. Metal conductive layer 506 can be formed from materials and by methods as described with respect to metal layer 302.

Figure 5D:
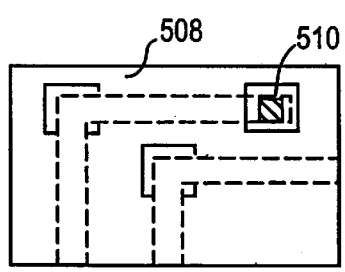
FIG. 5d is an overhead view illustrating the formation and patterning of a hard dielectric layer on the substrate of FIG. 5c.

Next, as shown in FIG. 5d, a hard dielectric layer 508 is formed over substrate 500, exposed portions of pattern buffer dielectric layer 504, and over first conductive layer 506. Hard dielectric layer 508 can be formed of materials and by processes as those described with respect to hard dielectric layer 310 to produce a dielectric layer with mechanical and electrical properties similar to those of hard dielectric layer 310.

Next, as also shown in FIG. 5d, microvias 510 are formed through hard dielectric layer 508 to expose a portion of first conductive layer 506 where electrical connection is desired. Microvias can be formed by methods as described with respect to forming microvia 312.

Figure 5E:
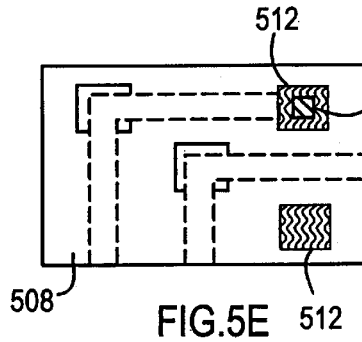
FIG. 5e is an overhead view illustrating the formation and patterning of a second buffer dielectric layer on the substrate of FIG. 5d.

Next, as shown in FIG. 5e, a second buffer dielectric layer 510 is formed over hard dielectric layer 508 over the sidewalls of hard dielectric layer 508 in microvia 510 and onto conductive layer 506 in microvia 510. Next, as also shown in FIG. 5e, buffer dielectric layer 510 is patterned as described above to leave a second buffer dielectric layer only at high stress locations such as where vias above and below are to be formed and at locations of corners of the subsequently deposited second conductive layer. Second buffer dielectric layer 512 formed on metal layer 506 must be removed during the patterning step to reopen via 510, as shown in FIG. 5e.

Figure 5F:
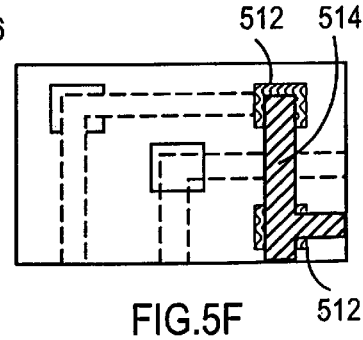
FIG. 5f is an overhead view illustrating the formation of a second conductive layer on the substrate of FIG. 5e.

Next, as shown in FIG. 5f, a second conductive layer 514 is formed over hard dielectric layer 508, second buffer dielectric layer 512 and onto first conductive layer 506 and via 510. The above referenced steps can be repeated any number of times to produce a multi-layer interconnect platform with as many dielectric/conductive layers as desired. By producing a buffer dielectric layer at high stress locations of the multi-layer stack, such as at corners and vias, a highly reliable interconnect structure can be formed.

Finally, as another embodiment of the strategy for selective buffering, the rubbery buffer layer can be optionally deposited on one of the several layers of the interconnect structure. An example is the incorporation of a buffer layer immediately below the bonding layer or below the bond pads. Another example is the implementation of a buffer layer at the junction of a base support (e.g., FR-4 or BT plate) and the first built-up layer.

Figure 7A:
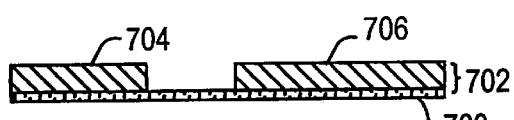
FIG. 7a is a cross-sectional view illustrating the formation of a metal layer on a base substrate.
Figure 7G:
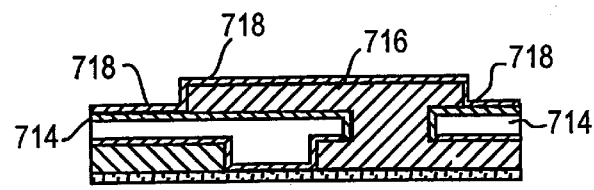
FIG. 7g is a cross-sectional view illustrating the formation of a buffer dielectric layer over the substrate of FIG. 7f.
Figure 7B:
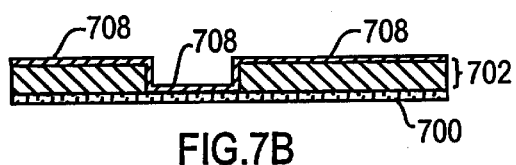
FIG. 7b is a cross-sectional view illustrating the formation of a buffer dielectric layer over the substrate of FIG. 7b.
Figure 7H:
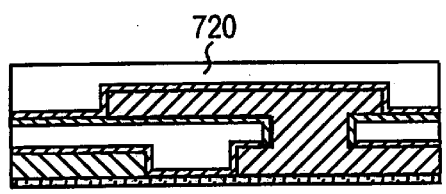
FIG. 7h is a cross-sectional view illustrating the formation of a hard dielectric layer over the substrate of FIG. 7g.
Figure 7C:
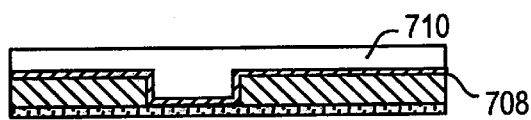
FIG. 7c is a cross-sectional view illustrating the formation of a hard dielectric layer over the substrate of FIG. 7b.
Figure 7I:
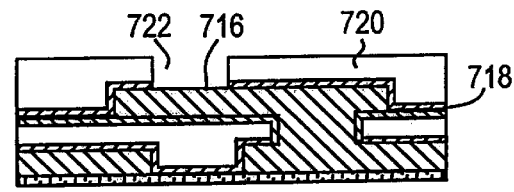
FIG. 7i is a cross-sectional view illustrating the formation of a microvia in the substrate of FIG. 7h.
Figure 7D:
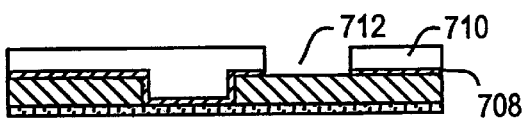
FIG. 7d is a cross-sectional view illustrating the formation of a microvia in the substrate of FIG. 7c.

FIG. 7a–7k illustrate a method of fabricating a high density interconnect platform using a combination of the "stack-up" and "surface modification" fabrication processes described earlier to generate a stratified composite layer. According to this embodiment of the present invention, a first metalization layer 702 including a plurality of individual interconnect lines 704 and 706 are formed on a base substrate 700. Metalization layer 702 can be formed of materials and by processes such as those described with respect to metalization layer 302. Next, as shown in FIG. 7b, a soft rubbery buffer dielectric layer 708 is formed over metal interconnect lines 704 and 706 and on top of base substrate 700. Buffer dielectric layer 708 is formed of materials and by processes such as those described with respect to buffer dielectric layer 308. Next, as shown in FIG. 7c, a hard dielectric layer 710 is formed over buffer dielectric layer 708. Hard dielectric layer 710 can be formed by processes and by materials such as those described with respect to hard dielectric layer 408. Next, as shown in FIG. 7d, a microvia 712 is formed through hard dielectric layer 710 and buffer dielectric layer 708. Microvia 712 can be formed by processes such as described with respect to microvia 312.

Figure 7J:
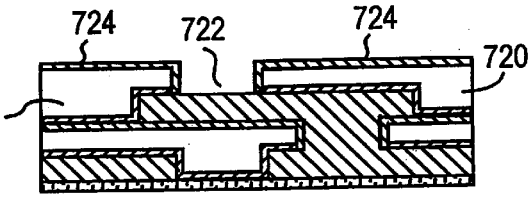
FIG. 7j is a cross-sectional view illustrating the formation of a buffer dielectric layer on exposed dielectric surfaces of FIG. 7i.
Figure 7E:
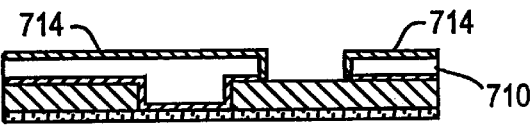
FIG. 7e is a cross-sectional view illustrating the formation of a buffer dielectric layer on the exposed dielectric surfaces of FIG. 7d.
Figure 7K:
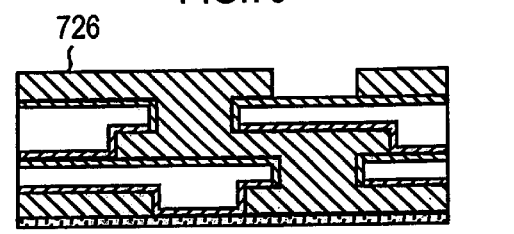
FIG. 7k is a cross-sectional view illustrating the formation of a third metal layer on the substrate of FIG. 7j.
Figure 7F:
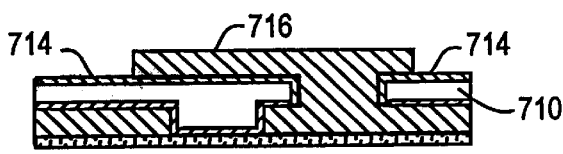
FIG. 7f is a cross-sectional view illustrating the formation of a metal layer on the substrate of FIG. 7e.

Next, as shown in FIG. 7e, the outer surfaces of hard dielectric layer 710 (including sidewalls of microvia 712) are modified into a soft rubbery buffer dielectric layer 714. Buffer dielectric layer 714 can be formed by processes such as those described with respect to buffer dielectric layer 412. Next, as shown in FIG. 7f, a second level of metalization 716 is formed on top of buffer dielectric layer 714 and into microvia 712 where it makes electrical contact with first metalization layer 702. Second metalization layer 716 can be formed by processes such as described with respect to metalization layer 302. Next, as shown in FIG. 7g, a buffer dielectric layer 718 is formed over buffer dielectric layer 714 and second metalization layer 716. Buffer dielectric layer is formed of a composition and by techniques such as described with respect to buffer dielectric layer 308. Next, as shown in FIG. 7h, a hard dielectric layer 720 is formed over buffer dielectric layer 718. Hard dielectric layer 720 is formed of materials and by processes such as described with hard dielectric layer 408. Next, as shown in FIG. 7i, a microvia 722 is formed through hard dielectric layer 720 and buffer dielectric layer 718 at locations where an electrical connection to second metalization layer 716 is desired. Microvia 716 can be formed by processes such as described with respect to microvia 312.

Next, as shown in FIG. 7j, the outer surface of hard dielectric layer 720 (including the sidewalls of microvias 722) are modified into a buffer dielectric layer 724. Buffer dielectric layer 724 can be formed by processes such as described with respect to buffer dielectric layer 412. Next, as shown in FIG. 7k, a third layer of metalization 726 is formed onto buffer dielectric layer 724 and onto second level of metalization 716 in via 722.

Additional layers can be added as described above in order to fabricate a multi-level interconnect platform with as many layers as desired. The above described technique provides a method for generating a high density interconnect platform where all dielectrics/metal interfaces are separated by a buffer dielectric layer.

Thus, the present invention has described several methods of fabricating a novel multi-layer interconnect platform having a stratified composite dielectric layer. In each case some or all of the interfaces between the hard rigid dielectric, which makes up the framework of the platform and provides structural support and the conductive layers, are separated by a soft rubbery (compliant) buffer dielectric. By separating the hard dielectric layer from the metal conductor, stresses resulting from temperature changes and/or clamping-induced curvature flattening are reduced, providing for enhanced reliability and enabling the fabrication of additional layers to the platform.

Another advantage of the present invention is that it can produce a buffer dielectric layer with a dielectric constant which is lower than the hard dielectric layer. Providing a low dielectric constant buffer dielectric near the conductive lines reduces electrical coupling between lines while increasing signal propagation speed. Yet another advantage of the present invention is that it can produce a buffer dielectric layer which is more resistant to water absorption than hard dielectric layer 408 or 310 (which can be approximately 0.1–0.5 wt. % $H_2O$ absorption in 24 hours for typical hard dielectric materials). Water absorption can cause reliability problems as well as increase the dielectric constant of films. Still another advantage is that rubberized buffer layers may adhere more strongly to metal conductors than the rigid dielectrics. The reduction of stress also helps the adhesion properties between the metal and dielectric layers. Thus, interlayer delamination or dielectric cracking can be largely eliminated, with concomitant improvement of package reliability.

The novel interconnect platform of the present invention can be used at any level of electrical interconnection or packaging desired. For example the interconnect platform of the present invention can be used as a substrate for a multi-chip module or as a substrate in a single chip package, such as a ball grid array (BGA). Additionally the interconnect platform of the present invention can be used to form the built-up layers of a printed wiring board used to couple many chips together in a system. Still further the interconnect platform of the present invention can be used to form only the outer most levels of interconnection on a printed wiring board which utilizes plated through holes. Still further the interconnect platform of the present invention can be connected to integrated circuits by any well-known technique such as but not limited to controlled chip collapse connections (C4, also known as a flip chip), tape automated bonding (TAB), and wire bonding. The outer most level (bond layer) of the interconnect platform of the present invention would be configured to receive the desired type of electrical connection.

As semiconductor processing equipment continues to evolve, new fabrication techniques may be developed or enabled. Such refinements may be adopted for the manufacture of stratified-dielectric-based interconnect devices. It is conceivable that future high density interconnect schemes can eliminate the use of BGA (e.g., multi-chip substrate 104). The chips can be directly mounted on printed wiring boards with built-up layers having successively increasing interconnect densities and finer line widths and spacings. The use of such high density and robust interconnect schemes allows the signals to propagate and distribute from footprints of the mounted chips to motherboard level dimensions.

Several different methods for fabricating a multi-layer interconnect platform with a stratified composite dielectric layer have been described. It is to be appreciated that each of the methods can be used independently or in combination with one another to produce a variety of different multi-layer interconnect platforms. As such the above described examples are to be taken as exemplary of the present invention rather than as limiting wherein the scope of the present invention is to be measured by the appended claims which follow.

Thus, a highly reliable interconnect platform having a stratified composite dielectric layer and its method of fabrication has been described.

I claim:

1. An interconnect platform comprising:
a rigid dielectric layer formed above a substrate;
a soft buffer dielectric layer formed on said rigid dielectric layer wherein said soft buffer dielectric has an elastic modulus less than said rigid dielectric layer; and
a metal layer formed on said soft buffer layer.

2. The interconnect platform of claim 1 wherein said soft buffer dielectric layer has a greater rubber content than said rigid dielectric layer.

3. The interconnect platform of claim 1 wherein said soft buffer dielectric layer has an elastic modulus 2–2,000 times lower than said rigid dielectric layer.

4. The interconnect platform of claim 1 wherein said soft buffer dielectric layer has an elastic modulus between 10–1,000 times lower than said rigid dielectric layer.

5. The interconnect platform of claim 1 wherein said soft buffer dielectric layer has an elastic modulus between 100–1,000 times lower than said rigid dielectric layer.

6. The interconnect platform of claim 1 wherein the soft buffer dielectric layer comprises an epoxy resin modified by alcohol chain grafting.

7. The interconnect platform of claim 6 wherein said rigid dielectric layer includes pendant hydroxyl groups on an epoxy backbone.

8. The interconnect platform of claim 1 wherein said soft buffer layer has a rubbery chain grafted onto 30–50% of pendant hydroxyl groups of epoxy backbone chains.

9. The interconnect platform of claim 1 wherein said soft buffer layer is a rubberized interpenetrating network on the surface of said rigid dielectric.

10. The platform of claim 1 wherein said soft buffer layer is a grafted rubbery interconnect layer on the surface of said rigid dielectric layer.

11. The interconnect platform of claim 1 wherein said soft buffer layer has an elastic modulus of between 1 MPa and 1 GPa.

12. An interconnect platform comprising:
a conductive interconnect line;
a rigid dielectric layer; and
a soft buffer dielectric layer formed between said rigid dielectric layer and said conductive interconnect line, wherein said soft buffer dielectric layer is more flexible than said rigid dielectric layer.

13. The interconnect platform of claim 12 wherein said soft buffer dielectric layer completely surrounds said interconnect line.

14. The interconnect platform of claim 12 wherein said soft buffer dielectric layer has a greater rubber content than said rigid dielectric layer.

15. The interconnect platform of claim 12 wherein said soft buffer dielectric layer has an elastic modulus less than the elastic modulus of said rigid dielectric layer.

16. The interconnect platform of claim 12 wherein said soft buffer dielectric layer has an elastic modulus of between 2–2,000 times lower than said rigid dielectric layer.

17. The interconnect platform of claim 12 wherein said soft buffer dielectric layer has a dielectric constant lower than said rigid dielectric layer.

18. The interconnect platform of claim 12 wherein said soft buffer dielectric layer has a water absorption level lower than said rigid dielectric layer.

19. The interconnect platform of claim 12 wherein said soft buffer layer has an adhesion tendency towards said conductive interconnect line greater than said rigid dielectric layer.

20. An interconnect platform comprising:
a conductive interconnect line;
a rigid dielectric layer; and
a soft buffer dielectric layer formed between said rigid dielectric layer and said conductive interconnect line, wherein said soft buffer dielectric layer has a glass transition temperature less than the operating temperature of said interconnect platform.

21. The interconnect platform of claim 20 wherein said soft buffer dielectric layer has a glass transition temperature less than 25° C.

22. An interconnect platform comprising:
a conductive interconnect line;
a rigid dielectric layer; and
a soft buffer dielectric layer formed between said rigid dielectric layer and said conductive interconnect line, wherein said soft buffer dielectric layer has a lower dielectric constant than said rigid dielectric layer.

23. An interconnect platform comprising:

a conductive interconnect line;

a rigid dielectric layer; and a soft buffer dielectric layer formed between said rigid dielectric layer and said conductive interconnect line, wherein said soft buffer dielectric layer has a water absorption level lower than said rigid dielectric layer.

24. An interconnect platform comprising:

a conductive interconnect line;

a rigid dielectric layer; and a soft buffer dielectric layer formed between said rigid dielectric layer and said conductive interconnect line, wherein said soft buffer dielectric layer has greater adhesion tendency towards said conductive interconnect line than said rigid dielectric layer.

25. An interconnect platform comprising:

a conductive interconnect lines;

a rigid dielectric layer; and a soft buffer dielectric layer formed between said rigid dielectric layer and said conductive interconnect lines, wherein said soft buffer dielectric layer has a glass transition temperature less than said rigid glass transition temperature of said dielectric layer.

26. An interconnect platform comprising:

a conductive interconnect lines;

a rigid dielectric layer having a modulus of a elasticity of between 1 to 30 GPa; and a soft buffer dielectric layer formed between said rigid dielectric layer and said conductive interconnect line, wherein said soft buffer dielectric layer has a modulus of elasticity of between 1 MPa and 1 GPa and wherein said soft buffer dielectric layer has a lower modulus of elasticity than said rigid dielectric layer.

* * * * *